(12) United States Patent
Mok et al.

(10) Patent No.: US 12,125,832 B2
(45) Date of Patent: *Oct. 22, 2024

(54) SEMICONDUCTOR DEVICE AND METHOD OF MANUFACTURING A SEMICONDUCTOR DEVICE

(71) Applicant: Amkor Technology Singapore Holding Pte. Ltd., Singapore (SG)

(72) Inventors: In Su Mok, Seoul (KR); Won Geol Lee, Seoul (KR); Il Bok Lee, Incheon (KR); Won Myoung Ki, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 405 days.

This patent is subject to a terminal disclaimer.

(21) Appl. No.: 17/510,598

(22) Filed: Oct. 26, 2021

(65) Prior Publication Data
US 2022/0045037 A1 Feb. 10, 2022

Related U.S. Application Data

(63) Continuation of application No. 16/423,424, filed on May 28, 2019, now Pat. No. 11,158,615.

(51) Int. Cl.
*H01L 25/10* (2006.01)
*H01L 21/48* (2006.01)
(Continued)

(52) U.S. Cl.
CPC ........ *H01L 25/105* (2013.01); *H01L 21/4853* (2013.01); *H01L 23/3128* (2013.01);
(Continued)

(58) Field of Classification Search
CPC ............... H01L 25/105; H01L 21/4853; H01L 23/3128; H01L 23/3135; H01L 23/5383;
(Continued)

(56) References Cited

U.S. PATENT DOCUMENTS 8,890,628 B2 11/2014 Nair et al.
11,158,615 B2 * 10/2021 Mok ................. H01L 23/49811
(Continued)

FOREIGN PATENT DOCUMENTS

TW 201814850 A 2/2020
TW 201740522 A 10/2020

OTHER PUBLICATIONS

Office Action for Taiwan Patent Application No. 109109447 mailed Jan. 29, 2024.
(Continued)

*Primary Examiner* — Fernando L Toledo
*Assistant Examiner* — Neil R Prasad
(74) *Attorney, Agent, or Firm* — Spectrum IP Law Group LLC

(57) ABSTRACT

In one example, a semiconductor device comprises a base assembly comprising a first substrate, a first device on a top surface of the first substrate, and a first encapsulant on the top surface of the first substrate and bounding a side surface of the first device. The semiconductor device further comprises a conductive pillar on the first substrate and in the first molding compound, wherein the conductive pillar comprises a non-conductive pillar core and a conductive pillar shell on the pillar core.

20 Claims, 5 Drawing Sheets

(51) Int. Cl.
*H01L 23/31* (2006.01)
*H01L 23/538* (2006.01)
*H01L 25/00* (2006.01)

(52) U.S. Cl.
CPC ...... *H01L 23/3135* (2013.01); *H01L 23/5383* (2013.01); *H01L 23/5385* (2013.01); *H01L 23/5386* (2013.01); *H01L 23/5389* (2013.01); *H01L 25/50* (2013.01); *H01L 2225/1058* (2013.01)

(58) Field of Classification Search
CPC ............. H01L 23/5385; H01L 23/5386; H01L 23/5389; H01L 25/50; H01L 2225/1058
See application file for complete search history.

(56) References Cited

U.S. PATENT DOCUMENTS

| | | | |
|---|---|---|---|
| 2013/0075936 A1* | 3/2013 | Lin | H01L 21/561 438/109 |
| 2016/0104668 A1 | 4/2016 | Lii et al. | |
| 2017/0200702 A1 | 7/2017 | Hung et al. | |
| 2018/0082988 A1 | 3/2018 | Cheng et al. | |
| 2018/0350784 A1 | 12/2018 | Cheng et al. | |
| 2021/0098434 A1 | 4/2021 | Cheng et al. | |

OTHER PUBLICATIONS

Office Action for Taiwan Patent Application No. 109109447 mailed Apr. 17, 2024.

* cited by examiner

SEMICONDUCTOR DEVICE AND METHOD OF MANUFACTURING A SEMICONDUCTOR DEVICE

CROSS-REFERENCE TO RELATED APPLICATIONS

The present application is a continuation of U.S. application Ser. No. 16/423,424 filed May 28, 2019, now U.S. Pat. No. 11,158,615 issued Oct. 26, 2021. Said application Ser. No. 16/423,424 and said U.S. Pat. No. 11,158,615 are hereby incorporated by reference in their entireties.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
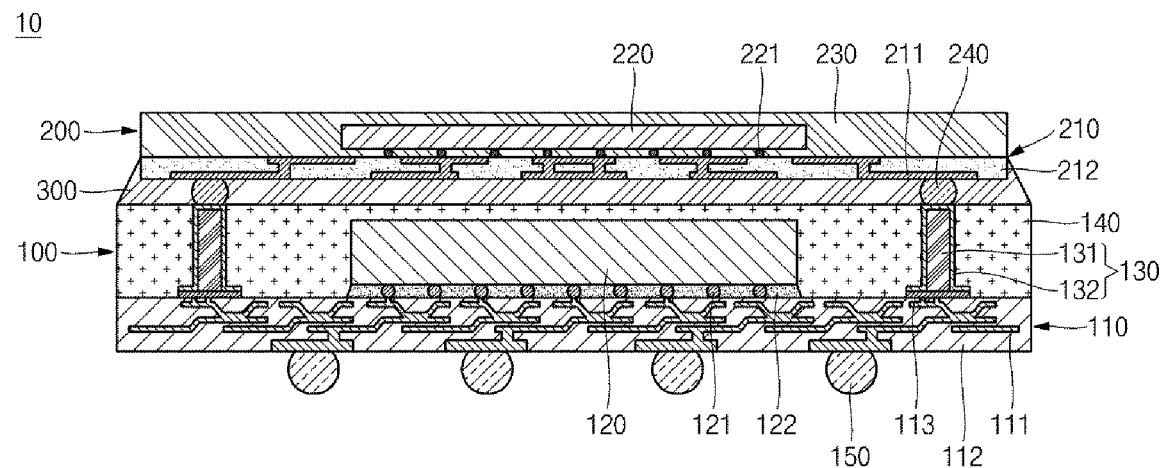
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "first," "second," etc. may be used to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a base assembly comprising a first substrate, a first device on a top surface of the first substrate, and a first encapsulant on the top surface of the first substrate and bounding a side surface of the first device. The semiconductor device further comprises a conductive pillar on the first substrate and in the first molding compound, wherein the conductive pillar comprises a non-conductive pillar core and a conductive pillar shell on the pillar core.

In another example, a method to manufacture a semiconductor device comprises providing a pillar core of non-conductive material on a top surface of a first substrate, providing a pillar shell on the pillar core to form a conductive pillar; placing a first device on the top surface of the first substrate, and providing a first encapsulant on the top surface of the first substrate to contact a side surface of the first device and the conductive pillar.

In a further example, a method to manufacture a semiconductor device comprises providing a redistribution layer (RDL) substrate on a carrier, wherein the RDL substrate comprises a dielectric structure and a redistribution structure in the dielectric structure, providing a non-conductive material on a top surface of the RDL substrate, removing a portion of the non-conductive material to form a pillar core, providing a pillar shell on the pillar core to form a conductive pillar electrically coupled with the redistribution structure, placing a device on the RDL substrate to contact the redistribution structure, providing an encapsulant on the top surface of the RDL substrate and in contact with a side surface of the device, and removing the carrier and providing an interconnect on a bottom surface of the RDL substrate electrically coupled with the redistribution structure.

Other examples are included in the present disclosure. Such examples may be found in the figures, in the claims, and/or in the description of the present disclosure.

FIG. 1 shows a cross-sectional view of an example semiconductor device 10. In the example shown in FIG. 1, semiconductor device 10 can comprise a base assembly 100, a top assembly 200 positioned on base assembly 100, and interface layer 300 interposed between base assembly 100 and top assembly 200.

Base assembly 100 can comprise a substrate 110, an electronic device 120, conductive pillars 130, encapsulant 140, and external interconnects 150. Substrate 110 can comprise redistribution structure 111 and dielectric structure 112. Redistribution structure 111 can be electrically connected to electronic device 120 and external interconnects 150. In addition, substrate 110 can further comprise pads 113 formed on a top surface of substrate 110 and electrically connected to redistribution structure 111. Pads 113 can be part of redistribution structure 111. Redistribution structure 111 and dielectric structure 112 can respectively represent one or more conductive layers and dielectric layers that can be alternatingly stacked over each other to define substrate 110. Each conductive layer of redistribution structure 111 can comprise one or more conductive patterns, traces, and/or vias along which signals, current, or voltages can be carried or redistributed across substrate 110. In addition, one or more portions of a conductive layer of redistribution structure 111 can have or can be formed with one or more sublayers of one or more conductive materials stacked on each other. Interconnects 121 can be formed at a bottom surface of electronic device 120 and can couple electronic device 120 to substrate 110. Interface layer 122 can be located between electronic device 120 and substrate 110 and can encapsulate interconnects 121. Conductive pillar 130 can comprise a pillar core 131 and a pillar shell 132. Conductive pillar 130 can be located laterally displaced from electronic device 120 on the top surface of substrate 110 and can provide electrical connection between substrate 110 and top assembly 200. Encapsulant 140 can encapsulate electronic device 120, conductive pillar 130, and the top surface of substrate 110. External interconnects 150 can be formed on the bottom surface of substrate 110 to couple semiconductor device 10 to an external device or components, such as a printed circuit board.

Top assembly 200 can comprise a substrate 210, an electronic device 220, an encapsulant 230 and interconnects 240. Substrate 210 can comprise redistribution structure 211 and dielectric structure 212, which can be similar to redistribution structure 111 and dielectric structure 112 as described above. Redistribution structure 211 can be electrically connected to electronic device 220 and interconnects 240. Electronic device 220 can be formed on substrate 210. Interconnects 221 can be formed on a bottom surface of electronic device 220 and can couple electronic device 220 to substrate 210. Encapsulant 230 can encapsulate electronic device 220 and the top surface of substrate 210.

Substrates 110 and 210, conductive pillars 130, encapsulants 140, 230 and 300 and interconnects 150 and 240 can be referred to as a semiconductor package or a package. Semiconductor package can protect electronic devices 120 and 220 from being exposed to external factors and/or circumstances. In addition, semiconductor package can provide electrical connections between an external component (not shown) and electronic devices 120 and 220.

FIGS. 2A to 2L show cross-sectional views of an example method for manufacturing semiconductor device 10. Specifically, FIGS. 2B to 2G show partially enlarged plan views of a manufacturing process in a portion "P" shown in FIG. 2A.

Figure 2A:
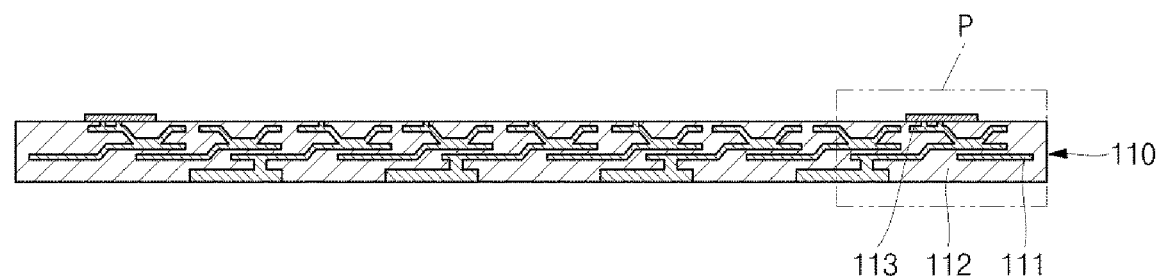
FIGS. 2A to 2L show cross-sectional views of an example method for manufacturing an example semiconductor device.

FIG. 2A shows a cross-sectional view of semiconductor device 10 at an early stage of manufacture. In the example shown in FIG. 2A, substrate 110 can comprise redistribution structure 111, dielectric structure 112 and pads 113. Substrate 110 can comprise, for example, a printed circuit board having a core, a coreless substrate, for example a buildup substrate built layer by layer on a carrier and lacking a core such as a fiberglass layer, a Silicon-Less Integrated Module (SLIM) interposer, or a Silicon Wafer Integrated Fan-out Technology (SWIFT) interposer, a leadframe, a micro leadframe, a semiconductor die, an interposer, for example silicon or glass interposer, and so on.

In some examples, redistribution structure 111 can comprise or be referred to as a conductive layer, a metal layer, a wiring layer or a circuit pattern. Redistribution structure 111 can comprise, for example, an electrically conductive material, such as gold (Au), silver (Ag), copper (Cu), aluminum (Al), or palladium (Pd). In addition, redistribution structure 111 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). The thickness of a layer of redistribution structure 111 can range from about 2 microns to about 10 microns. Redistribution structure 111 can have a multilayered structure. Redistribution structure 111 can be exposed at the top surface of substrate 110 to be electrically connected to electronic device 120 and/or conductive pillar 130. In addition, redistribution structure 111 can be exposed at the bottom surface of substrate 110 to be electrically connected to interconnects 150.

In some examples, dielectric structure 112 can comprise or be referred to as a dielectric layer, a passivation layer, an insulating layer or a protection layer. In some examples, dielectric structure 112 can comprise, for example, an oxide layer, a nitride layer, and an electrically insulating material, such as polyimide (PI), benzocyclobutene (BCB), polybenzoxazole (PBC)), bismaleimide triazine (BT), a phenolic resin, or an epoxy. In addition, dielectric structure 112 can be formed using, for example, thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, or evaporating. The thickness of a layer of dielectric structure 112 can range from about 4 microns to about 12 microns. In some examples, dielectric structure 112 can protect redistribution structure 111 from being exposed to external factors or circumstances.

In some examples, pad 113 can comprise or be referred to a land or an under-bump-metallization (UBM). Pad 113 can include, for example, an electrically conductive material, such as gold (Au), silver (Ag), copper (Cu), aluminum (Al), or palladium (Pd). The pad 113 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In addition, a width of pad 113 can be formed wider than a width of conductive pillar 130. The width of pad 113 can range from about 60 microns to about 250 microns. In addition, the thickness of pad 113 can range from about 2 microns to about 10 microns. Pad 113 can be formed on redistribution structure 111 exposed to the top surface of substrate 110 and can be electrically connected to redistribution structure 111.

In some examples, substrate 110 can be a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride ($Si_3N_4$), silicon oxide ($SiO_2$), and/or SiON. The inorganic dielectric layer(s) can be formed by growing the inorganic dielectric layers using an oxidation or nitrodization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

In some examples, substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

Figure 2B:
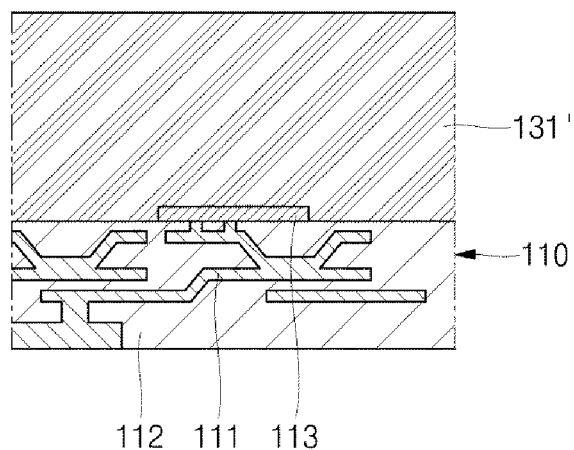

FIG. 2B shows a cross-sectional view of semiconductor device 10 at a later stage of manufacture. In the example shown in FIG. 2B, a non-conductive material 131' can be formed on the top surface of substrate 110. In some examples, non-conductive material 131' can be referred to as an insulating layer or a dielectric layer. Insulating layer 131' can include, for example, an electrically insulating material, such as a polymer, polyimide (PI), benzocyclobutene (BCB), polybenzoxazole (PBO), bismaleimide triazine (BT), a molding material, a phenolic resin, an epoxy, silicone, a dry-film layer, a dry-film photosensitive dielectric material (PDM), a dry-film polymer dielectric, or an acrylate polymer. In addition, insulating layer 131' can be formed using, for example, spin coating, spray coating, printing, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), sheet lamination, or evaporation. Insulating layer 131' can be formed to cover pads 113 formed on the top surface of substrate 110.

Figure 2C:
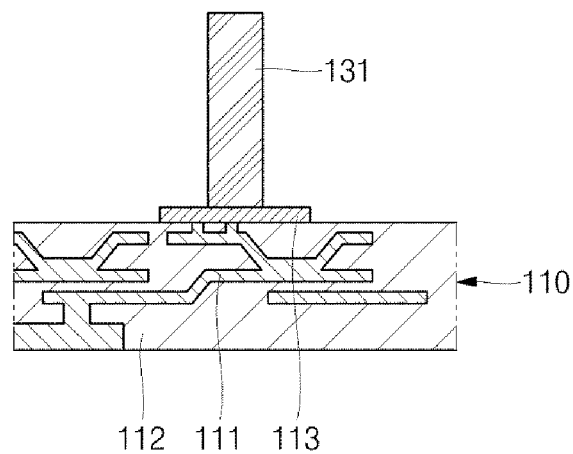

FIG. 2C presents a cross-sectional view of semiconductor device 10 at a later stage of manufacture. In the example shown in FIG. 2C, pillar core 131 can be formed by removing a portion of insulating layer 131'. For example, pillar core 131 can be formed by providing a mask pattern at a portion on insulating layer 131', where conductive pillar 130 is to be formed, and etching insulating layer 131' from a portion where the mask pattern is not formed. Pillar core 131 can be formed on pad 113 and can have a width smaller than pad 113. The height of pillar core 131 can range from about 100 microns to about 300 microns. In addition, the width of pillar core 131 can range from about 50 microns to about 200 microns. Pillar core 131 can be positioned towards edges of substrate 110 to allow electronic device 120 to be easily placed at an interior side of substrate 110.

Figure 2D:
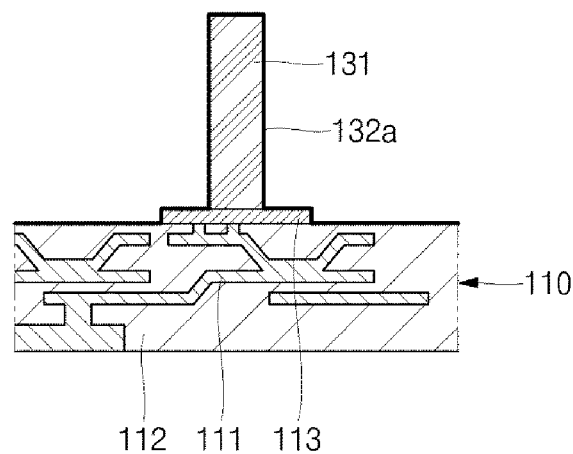

FIG. 2D shows a cross-sectional view of semiconductor device 10 at a later stage of manufacture. In the example shown in FIG. 2D, a seed layer 132a can be formed on the top surface of substrate 110 and the surface of pillar core 131. Seed layer 132a can include, for example, an electrically conductive material, such as gold (Au), silver (Ag), copper (Cu), aluminum (Al), or titanium (Ti). In addition, seed layer 132a can be formed using, for example, physical vapor deposition (PVD), chemical vapor deposition (CVD), atomic layer deposition (ALD), plasma vapor deposition, electroless plating, or electrolytic plating. In some examples, PVD can be referred to as sputtering. Seed layer 132a can be thinly deposited on substrate 110, pads 113 and pillar core 131. The thickness of seed layer 132a can range from about 50 nanometer to about 200 nanometer. As explained below, seed layer 132a can be provided for facilitating the process of providing pillar shell 132 as a conductive casing over the insulating material of pillar core 131.

Figure 2E:
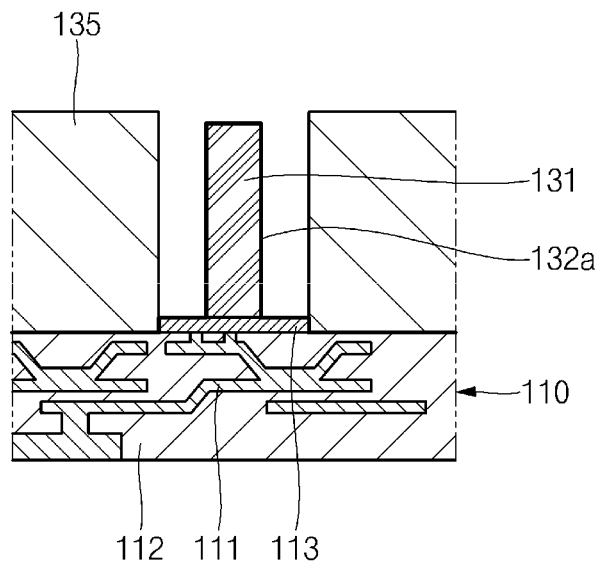

FIG. 2E shows a cross-sectional view of semiconductor device 10 at a later stage of manufacture. In the example shown in FIG. 2E, photoresist 135 can be formed on substrate 110 and a portion of photoresist 135 can be removed, thereby exposing pillar core 131 and pad 113. For example, photoresist 135 can be coated on substrate 110 and/or on seed layer 132a, and a portion of photoresist 135 can be removed through exposure and development, thereby exposing pillar core 131 and pad 113.

Figure 2F:
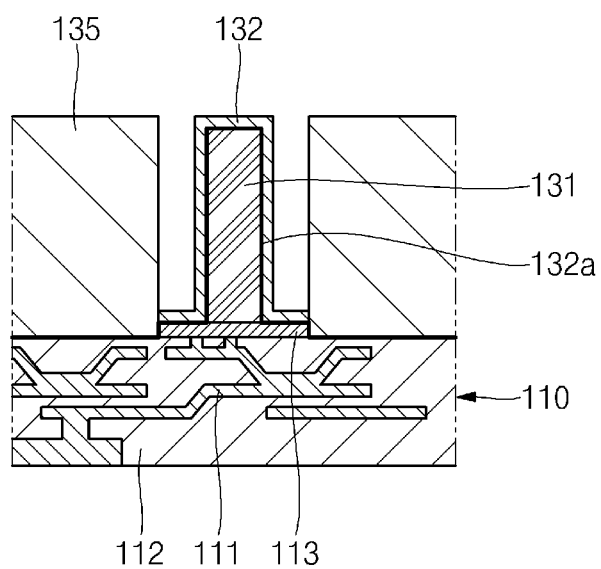

FIG. 2F shows a cross-sectional view of semiconductor device 10 at a later stage of manufacture. In the example shown in FIG. 2F, pillar shell 132 can be formed on exposed seed layer 132a. Pillar shell 132 can be formed to cover pillar core 131 and pad 113. Pillar shell 132 can include, for example, an electrically conductive material, such as gold (Au), silver (Ag), copper (Cu) or aluminum (Al). In addition, pillar shell 132 can be formed using, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). The thickness of pillar shell 132 can range from about 10 microns to about 50 microns. Pillar shell 132 covers pillar core 131 and is electrically connected to pad 113.

Figure 2G:
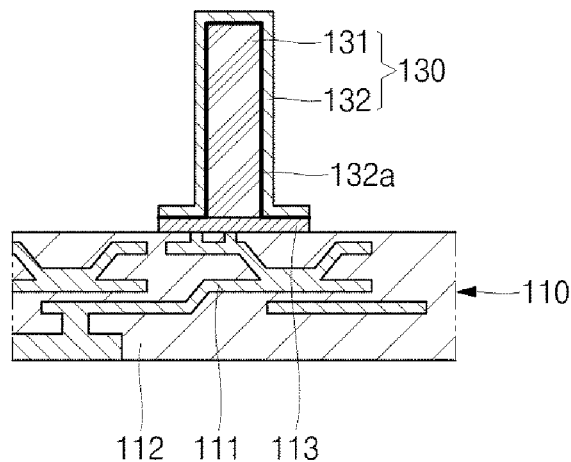
Figure 2H:
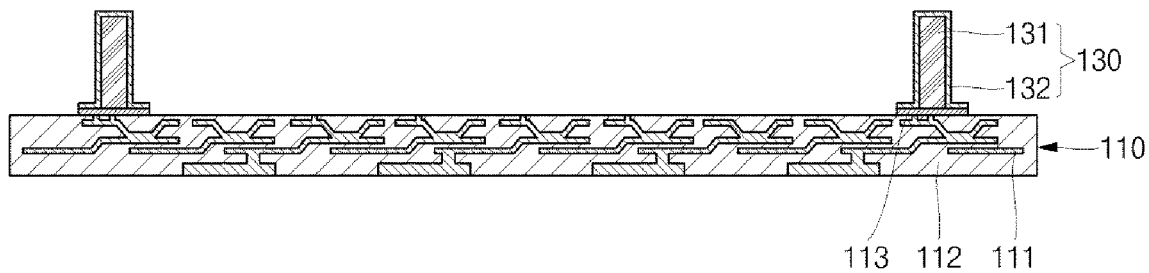

FIGS. 2G and 2H show a cross-sectional view of semiconductor device 10 at a later stage of manufacture. In the example shown in FIG. 2G, photoresist 135 and the portion of seed layer 132a positioned under photoresist 135 are removed, which can be achieved by, for example, dry etching or wet etching. Conductive pillar 130, including pillar core 131, seed layer 132a and pillar shell 132, can thus be finalized. The height of conductive pillar 130 can be equal to or greater than that of electronic device 120. For example, the height of conductive pillar 130 can range from about 110 microns to about 350 microns. Since pillar core 131 positioned within conductive pillar 130 is made of an insulating material, manufacturing cost and/or time can be reduced. For example, if a conductive pillar needs to be made of only a conductive material, such as a metal, the time and/or cost required for plating such metal would be higher. In the example of FIG. 2G, however, conductive pillar 130 includes pillar core 131 within, and the formation of pillar core 131 out of insulating layer 131' (FIG. 2B) is faster and less expensive than having to plate the same corresponding core volume out of metal. Because conductive pillar 130 comprises conductive pillar shell 132 formed on the surface of pillar core 131, it can fulfill the function of a conductive pillar much like a conventional conductive pillar. In the example shown in FIG. 2H, conductive pillar 130 can be formed at or near edges of substrate 110. Conductive pillar 130 can provide electrically connecting paths between base assembly 100 and top assembly 200.

Figure 2I:
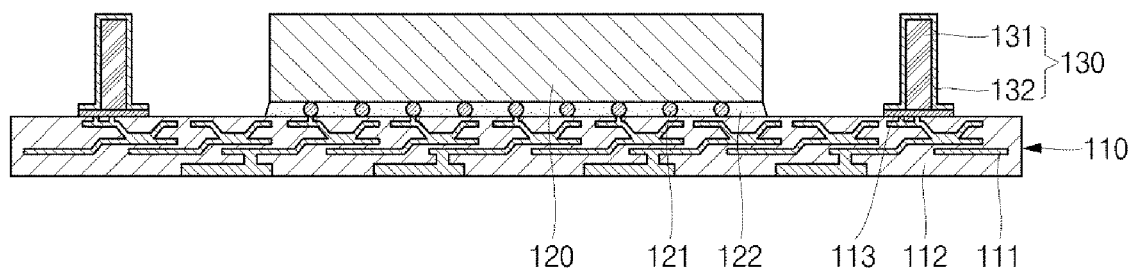

FIG. 2I shows a cross-sectional view of semiconductor device 10 at a later stage of manufacture. In the example shown in FIG. 2I, electronic device 120 can be attached to a top portion of substrate 110. In some examples, electronic device 120 can comprise a semiconductor die or a semiconductor package having one or more die. Semiconductor die 120 can comprise, for example, a semiconductor material such as silicon (Si). Semiconductor die 120 can comprise a passive electronic circuit (not shown) or an active electronic circuit, such as a transistor. In some examples, semiconductor die 120 can comprise, for example, an electrical circuit such as a digital signal processor (DSP), a microprocessor, a network processor, a power management processor, an audio processor, a radio-frequency (RF) circuit, a wireless baseband system-on-chip (SoC) processor, a sensor, or an application specific integrated circuit (ASIC). Semiconductor die 120 can comprise interconnects 121 and a molding material 122 or molding compound or underfill. In some examples, interconnects 121 can comprise conductive balls such as solder balls, conductive pillars such as copper pillars, and/or conductive posts having solder caps formed on copper pillars. The interconnect 121 can be formed on a bottom surface of semiconductor die 120 and can be electrically connected to redistribution structure 111 of substrate 110. Molding material 122 can be formed between semiconductor die 120 and substrate 110. In some examples, molding material 122 can be referred to as a molding compound or an underfill. Underfill 122 can comprise an epoxy, a thermoplastic material, a thermocurable material, polyimide, polyurethane, a polymeric material, a filled epoxy, a filled thermoplastic material, a filled thermocurable material, filled polyimide, filled polyurethane, a filled polymeric material, fluxing underfill, or the like.

In the example shown in FIG. 2I, semiconductor die 120 can be attached to the top portion of substrate 110 by electrically connecting interconnect 121 to of redistribution structure 111 substrate 110. Semiconductor die 120 can be electrically connected to redistribution structure 111 using, for example, a mass reflow process, a thermal compression process, or a laser bonding process. Underfill 122 can be formed by inserting an underfill material between semiconductor die 120 and substrate 110 followed by curing.

Figure 2J:
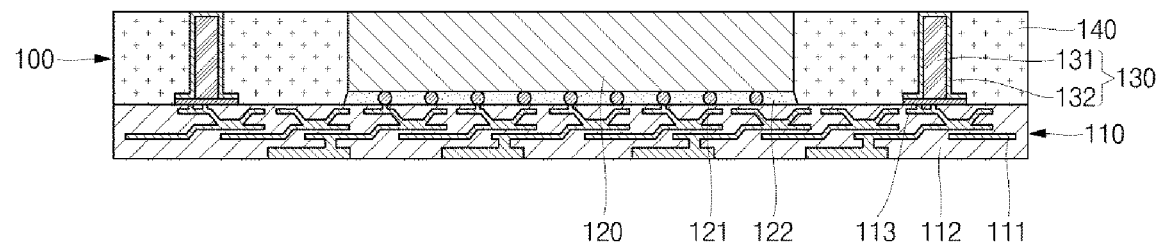

FIG. 2J shows a cross-sectional view of semiconductor device 10 at a later stage of manufacture. In the example shown in FIG. 2J, encapsulant 140 can encapsulate semiconductor die 120 and conductive pillar 130. Encapsulant 140 can encapsulate semiconductor die 120 and conductive pillars 130 on substrate 110. In some examples, encapsulant 140 can comprise a variety of encapsulating or molding materials including, for example, resin, a polymer compound material, a polymer having pillars, epoxy resin, epoxy resin having pillars, epoxy acrylate having pillars, silicon resin, combinations thereof, or equivalents thereof. In addition, encapsulant 140 can be formed using any of a variety of processes including, for example, a compression molding process, a liquid phase encapsulant molding process, a vacuum lamination process, a paste printing process, or a film assisted molding process. In some examples, underfill 122 can be part of encapsulant 140 instead of being applied prior to and separate from encapsulant 140. Encapsulant 140 can protect semiconductor die 120 and conductive pillars 130 from external circumstances. In such a manner, base assembly 100 including substrate 110, semiconductor die 120, conductive pillars 130 and encapsulant 140 can be completed. In some examples, base assembly 100 can comprise interconnects 150 formed under substrate 110.

Figure 2K:
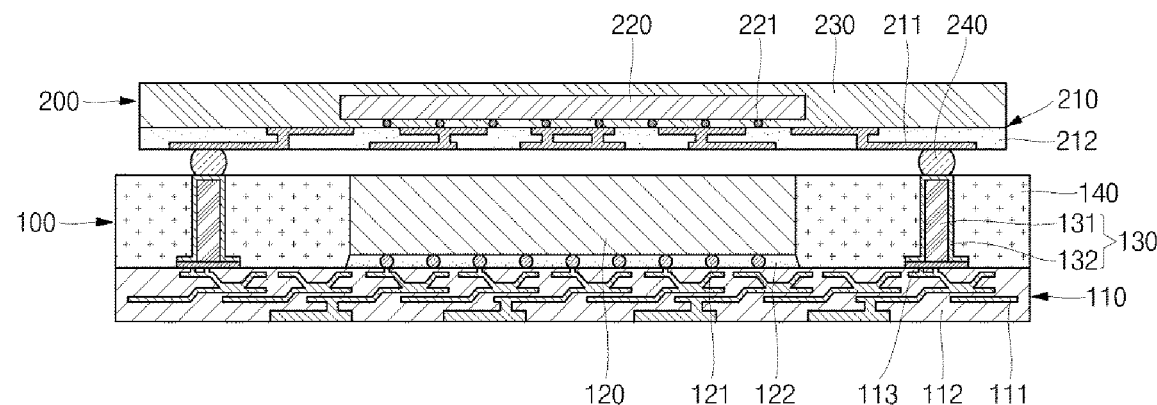

FIG. 2K shows a cross-sectional view of semiconductor device 10 at a later stage of manufacture. In the example shown in FIG. 2K, top assembly 200 can be attached to a top portion of base assembly 100. Top assembly 200 can comprise a substrate 210, an electronic device 220, an encapsulant 230 and interconnects 240. Substrate 210 can comprise a redistribution structure 211 and a dielectric structure 212. Top assembly 200 can be an assembly having a variety of structures or components, thus not limited to the structure illustrated. The different elements of top assembly 200 can be similar to and/or similarly formed like corresponding elements of base assembly 100 as described above. For example, substrate 210, redistribution structure 211, dielectric structure 212, electronic device 220, and/or encapsulant 230 of top assembly 200 can be respectively similar to substrate 110, redistribution structure 111, dielectric structure 112, electronic device 120, and/or encapsulant 130 of base assembly 100.

FIG. 2K presents substrate 210 as a pre-formed substrate, already formed prior to attachment to base assembly 100 using interconnects 240. There can be, however, examples where substrate 210 can instead be a redistribution structure formed directly atop base assembly 100 (on encapsulant 140 and/or electronic device 120, and coupled to pillars 130), rather than being pre-formed and then attached with interconnects 240. Afterwards, electronic device 220 and encapsulant 230 could be attached and formed over substrate 210. In other examples a redistribution structure similar to redistribution structure 110 or 120 can be formed directly on base assembly 100 on encapsulant 140 and/or electronic device 120 and coupled to pillars 130, and top assembly 200 could then be attached to such redistribution structure afterwards.

Figure 2L:
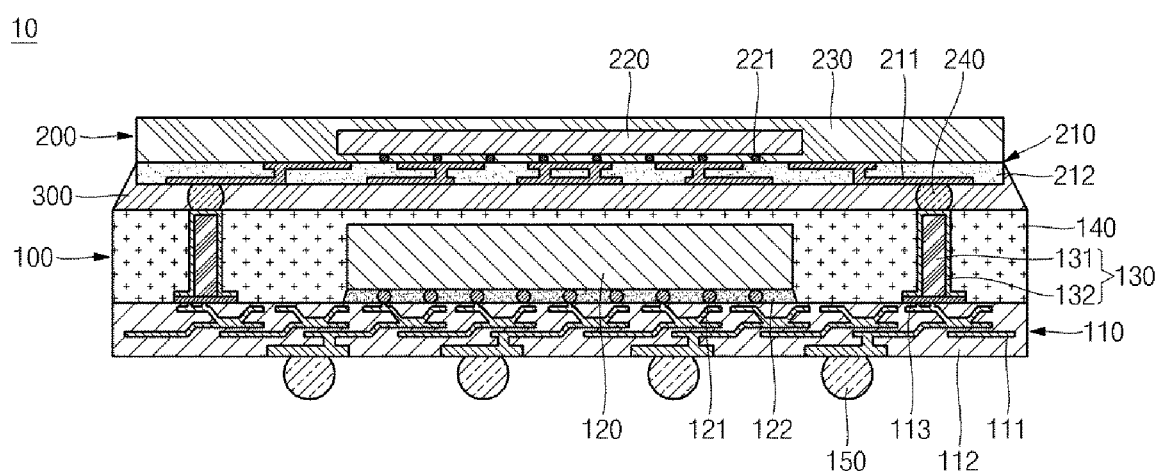

FIG. 2L shows a cross-sectional view of semiconductor device 10 at a later stage of manufacture. In the example shown in FIG. 2L, interface layer 300 can be formed between base assembly 100 and top assembly 200, and interconnects 150 can be formed on a bottom surface of base assembly 100. In other examples, interconnects 150 can be formed in advance before top assembly 200 is attached to base assembly 100.

In some examples, interface layer 300 can be referred to as an underfill. Underfill 300 can comprise an epoxy, a thermoplastic material, a thermocurable material, polyimide, polyurethane, a polymeric material, a filled epoxy, a filled thermoplastic material, a filled thermocurable material, filled polyimide, filled polyurethane, a filled polymeric material, fluxing underfill, or the like. For example, underfill 300 can be formed by injecting a liquid-phase or gel-type underfill between base assembly 100 and top assembly 200, followed by curing. Underfill 300 can enhance mechanical coupling strength between base assembly 100 and top assembly 200 while protecting interconnects 240.

Interconnects 150 can be electrically connected to redistribution structure 111 of substrate 110 of base assembly 100. In some examples, interconnects 150 can comprise conductive balls such as solder balls, conductive pillars such as copper pillars, and/or conductive posts having solder caps formed on copper pillars. Interconnects 150 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. Interconnects 150 can be formed using, for example, a ball drop process, a screen-printing process, or an electroplating process. The thickness of interconnects 150 can range from about 50 microns to about 350 microns. Interconnects 150 can provide an electrical connection between semiconductor device 10 and an external component or device (not shown).

The present disclosure comprises reference to certain examples, however, it will be understood by those skilled in the art that various changes may be made, and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. A semiconductor device, comprising:
   a base assembly comprising
      a first substrate,
      a first device on a top surface of the first substrate, and
      a first encapsulant on the top surface of the first substrate and bounding a side surface of the first device;
      a conductive pillar on the first substrate and in the first encapsulant; and
      an interconnect external to the first encapsulant;
   wherein:
      the conductive pillar comprises a non-conductive pillar core and a conductive pillar shell on the non-conductive pillar core;
      the non-conductive pillar core does not extend above a top side of the first encapsulant; and
      the interconnect is directly over the non-conductive pillar core and contacts the conductive pillar shell.

2. The semiconductor device of claim 1, further comprising a conductor on a top end of the non-conductive pillar core.

3. The semiconductor device of claim 2, wherein the conductor and the conductive pillar shell comprise the same material.

4. The semiconductor device of claim 2, wherein the conductor comprises a portion of the conductive pillar shell.

5. The semiconductor device of claim 1, wherein a top end of the non-conductive pillar core is below a top side of the first encapsulant.

6. The semiconductor device of claim 1, wherein:
   a top end of the conductive pillar shell is exposed from the first encapsulant; and
   a top end of the non-conductive pillar core is covered by the top end of the conductive pillar shell.

7. The semiconductor device of claim 1, further comprising:
   a top assembly comprising
      a second substrate,
      a second device on a top surface of the second substrate, and
      a second encapsulant on the top surface of the second substrate and bounding a side surface of the second device, and
      an interconnect on a bottom surface of the second substrate;
   wherein the interconnect couples the second substrate with a top end of the conductive pillar.

8. The semiconductor device of claim 7, further comprising:
   an interface layer between the top assembly and the base assembly, the interface layer bounding the interconnect of the top assembly.

9. The semiconductor device of claim 1, wherein:
   a top of the first encapsulant is substantially coplanar with a top end of the conductive pillar; and
   the top end of the conductive pillar extends further from the top surface of the first substrate than a top end of the first device.

10. The semiconductor device of claim 1, wherein:
    a top end of the first encapsulant is substantially coplanar with a top end of the conductive pillar and a top end of the first device.

11. The semiconductor device of claim 1, wherein:
    a width of the non-conductive pillar core is greater than a thickness of the conductive pillar shell;
    the width of the non-conductive pillar core is approximately 50 microns to approximately 200 microns; and
    the thickness of the conductive pillar shell is approximately 10 microns to approximately 50 microns.

12. A method to manufacture a semiconductor device, comprising:
    providing a pillar core of non-conductive material on a top surface of a first substrate;
    providing a pillar shell on the pillar core to form a conductive pillar;
    placing a first device on the top surface of the first substrate;

providing a first encapsulant on the top surface of the first substrate to contact a side surface of the first device and the conductive pillar; and providing an interconnect external to the first encapsulant;

wherein the pillar core does not extend above a top side of the first encapsulant; and wherein the interconnect is directly over the pillar core and contacts the pillar shell.

13. The method of claim 12, further comprising providing a conductor on a top end of the pillar shell.

14. The method of claim 13, wherein the conductor and the pillar shell comprise the same material.

15. The method of claim 13, wherein the conductor comprises a portion of the pillar shell.

16. The method of claim 12, wherein a top end of pillar core is below a top side of the first encapsulant.

17. The method of claim 12, wherein:

providing the pillar core comprises:

providing a non-conductive material on the top surface of the first substrate; and removing a portion of the non-conductive material to define the pillar core; and the pillar core is in direct contact with a pad of the first substrate.

18. A method to manufacture a semiconductor device, comprising:

providing a redistribution layer (RDL) substrate on a carrier, wherein the RDL substrate comprises a dielectric structure and a redistribution structure in the dielectric structure;

providing a non-conductive material on a top surface of the RDL substrate;

removing a portion of the non-conductive material to form a pillar core;

providing a pillar shell on the pillar core to form a conductive pillar electrically coupled with the redistribution structure;

placing a device on the RDL substrate to contact the redistribution structure;

providing an encapsulant on the top surface of the RDL substrate and in contact with a side surface of the device; and removing the carrier and providing an interconnect on a bottom surface of the RDL substrate electrically coupled with the redistribution structure;

wherein the pillar core does not extend above a top side of the encapsulant.

19. The method of claim 18, further comprising providing a conductor on a top end of the pillar core.

20. The method of claim 19, wherein the conductor and the pillar shell comprise the same material.

* * * * *